(12) United States Patent
Golda et al.

(10) Patent No.: US 10,734,269 B1
(45) Date of Patent: Aug. 4, 2020

(54) MICRO DEVICE METAL JOINT PROCESS

(71) Applicant: Apple Inc., Cupertino, CA (US)

(72) Inventors: Dariusz Golda, Redwood City, CA (US); James M. Perkins, Mountain View, CA (US); Andreas Bibl, Los Altos, CA (US); Sumant Sood, Union City, CA (US); Hyeun-Su Kim, Palo Alto, CA (US)

( * ) Notice: Subject to any disclaimer, the term of this patent is extended or adjusted under 35 U.S.C. 154(b) by 0 days.

(21) Appl. No.: 15/914,595

(22) Filed: Mar. 7, 2018

Related U.S. Application Data

(60) Provisional application No. 62/516,559, filed on Jun. 7, 2017.

(51) Int. Cl.
*H01L 21/683* (2006.01)
*H01L 23/00* (2006.01)
(Continued)

(52) U.S. Cl.
CPC .... *H01L 21/6835* (2013.01); *H01L 21/67144* (2013.01); *H01L 24/29* (2013.01);
(Continued)

(58) Field of Classification Search
CPC ..... H01L 33/36; H01L 33/54; H01L 2924/00; H01L 2924/12041; H01L 2924/12042; H01L 2924/1461; H01L 2221/68368; H01L 2224/04026; H01L 2224/05083; H01L 2224/29109; H01L 2224/29111; H01L 2224/29113; H01L 2224/83409; H01L 2224/83411; H01L 2224/83444; H01L 2224/83815; H01L 24/03; H01L 24/05; H01L 24/06; H01L 24/75; H01L 2924/10156; H01L 2924/00014; H01L 2924/01049; H01L 2924/0105; H01L 2924/0002; H01L 33/0079; H01L 24/83; H01L 24/95; H01L 25/0753; H01L 2924/01048; H01L 2924/01082; H01L 2924/01083; H01L 2924/01079; H01L 2924/014; H01L 2224/7598; H01L 2924/01029; H01L 33/405; H01L 2224/83; H01L 27/156; H01L 2924/0132;
(Continued)

(56) References Cited

U.S. PATENT DOCUMENTS 7,015,513 B2 * 3/2006 Hsieh .................. H01L 33/0079
257/642
7,510,963 B2 3/2009 Yang et al.
(Continued)

*Primary Examiner* — Mark W Tornow
*Assistant Examiner* — Priya M Rampersaud
(74) *Attorney, Agent, or Firm* — Jaffery Watson Mendonsa & Hamilton LLP

(57) ABSTRACT

Metal-to-metal adhesion joints are described as a manner to hold down micro devices to a carrier substrate within the context of a micro device transfer manufacturing process. In accordance with embodiments, the metal-to-metal adhesion joints must be broken in order to pick up the micro devices from a carrier substrate, resulting in micro devices with nubs protruding from bottom contacts of the micro devices. Once integrated, the micro devices are bonded to a receiving substrate, the nubs may be embedded in a metallic joint, or alternatively be diffused within the metallic joint as interstitial metallic material that is embedded within the metallic joint.

8 Claims, 10 Drawing Sheets

(51) Int. Cl.
*H01L 25/075* (2006.01)
*H01L 33/62* (2010.01)
*H01L 21/67* (2006.01)
*B65G 47/92* (2006.01)
*H01L 33/06* (2010.01)
*H01L 33/30* (2010.01)
*H01L 33/28* (2010.01)
*H01L 33/60* (2010.01)

(52) U.S. Cl.
CPC .......... *H01L 25/0753* (2013.01); *H01L 33/62* (2013.01); *B65G 47/92* (2013.01); *H01L 33/06* (2013.01); *H01L 33/28* (2013.01); *H01L 33/30* (2013.01); *H01L 33/60* (2013.01); *H01L 2221/68363* (2013.01); *H01L 2224/29019* (2013.01); *H01L 2224/29076* (2013.01); *H01L 2224/29124* (2013.01); *H01L 2224/29144* (2013.01); *H01L 2924/12041* (2013.01); *H01L 2933/0066* (2013.01)

(58) Field of Classification Search
CPC .......... H01L 2924/01327; H01L 33/44; H01L 33/62; H01L 2924/01031; H01L 21/67144; H01L 2924/01047; H01L 2924/0665; H01L 33/20; H01L 33/32; H01L 21/6835; H01L 2924/0103; H01L 2924/01033; H01L 2924/01051; H01L 2924/01322; H01L 2924/10253; H01L 2933/0066; H01L 33/0095; H01L 33/40; H01L 21/52; H01L 21/6836; H01L 2221/6835; H01L 2224/131; H01L 2224/13644; H01L 2224/13666; H01L 2224/2919; H01L 2224/45144; H01L 2224/75725; H01L 2224/83075; H01L 2224/83193; H01L 2224/83203; H01L 2224/83825; H01L 2224/95136; H01L 2224/97; H01L 24/29; H01L 24/93; H01L 25/50; H01L 2924/00013; H01L 2924/01015; H01L 2924/12043; H01L 2924/12044; H01L 2933/0016; H01L 33/06; H01L 33/22; H01L 33/38; H01L 33/387; H01L 21/7806; H01L 2221/68327; H01L 2221/6834; H01L 2224/0555; H01L 2224/0556; H01L 2224/05599; H01L 2224/13099; H01L 2224/29105; H01L 2224/29118; H01L 2224/29124; H01L 2224/29144; H01L 2224/29147; H01L 2224/29155; H01L 2224/29183; H01L 2224/75261; H01L 2224/75281; H01L 2224/75282; H01L 2224/75283; H01L 2224/83805; H01L 2224/8383; H01L 2224/83948; H01L 2224/95; H01L 2224/95001; H01L 23/10; H01L 2924/01005; H01L 2924/01006; H01L 2924/01007; H01L 2924/01023; H01L 2924/01046; H01L 2924/10329; H01L 2933/0025; H01L 33/007; H01L 33/42; H01L 33/46; H01L 33/56; H01L 33/60; H01L 21/18; H01L 21/268; H01L 21/304; H01L 21/6833; H01L 21/78; H01L 21/7813; H01L 2224/0554; H01L 2224/05568; H01L 2224/05573; H01L 2224/13144; H01L 2224/1319; H01L 2224/1358; H01L 2224/13582; H01L 2224/16; H01L 2224/32503; H01L 2224/48463; H01L 2224/73204; H01L 2224/73265; H01L 2224/81193; H01L 2224/8281; H01L 2224/83001; H01L 2224/83005; H01L 2224/83192; H01L 2224/83464; H01L 2224/838; H01L 2224/8381; H01L 2224/83908; H01L 2224/85181; H01L 2224/95145; H01L 22/20; H01L 23/49811; H01L 24/16; H01L 24/32; H01L 24/80; H01L 24/90; H01L 24/97; H01L 25/167; H01L 27/124; H01L 27/14618; H01L 27/14683; H01L 27/15; H01L 27/153; H01L 2924/01012; H01L 2924/01013; H01L 2924/01019; H01L 2924/01022; H01L 2924/01075; H01L 2924/01078; H01L 2924/09701; H01L 2924/1033; H01L 2924/10349; H01L 2924/14; H01L 2924/1421; H01L 2924/1431; H01L 2924/1434; H01L 2924/15153; H01L 2933/0033; H01L 2933/0041; H01L 2933/005; H01L 31/0203; H01L 31/16; H01L 33/04; H01L 33/08; H01L 33/24; H01L 33/28; H01L 33/30; H01L 33/504; H01L 33/505; H01L 33/508; H01L 33/52; H01L 33/58; H01L 33/642; H05K 13/00; H05K 1/111; H05K 2201/0367; H05K 2201/10977; H05K 2203/1189; H05K 3/305; H05K 3/326; H05K 3/4007; Y10T 156/1153; Y10T 29/49124; Y10T 156/1707; Y10T 156/1744; Y10T 156/1749; Y10T 156/1776; Y10T 29/49121; Y10T 29/4913; Y10T 29/49139; Y10T 29/49144; Y10T 29/49155; Y10T 428/12889; Y10T 428/12986; B05C 5/0204; B05C 9/12; B05C 9/14; B23K 1/0016; B32B 15/01; B32B 15/018; B32B 2457/20; B32B 37/025; B32B 37/06; B82Y 20/00; C23C 14/14; C23C 14/34; C23C 16/01; C23C 16/45525; C23C 16/50; C23C 16/56; C30B 25/18; H01R 12/52; H01R 13/03; H01R 13/24; H01S 5/02228; H01S 5/02232; H01S 5/02236; H01S 5/0224; H03H 9/1014; H03H 9/105
See application file for complete search history.

(56) References Cited

U.S. PATENT DOCUMENTS

| | | | | |
|---|---|---|---|---|
| 8,333,860 | B1* | 12/2012 | Bibl | .................. H01L 21/67144 156/249 |
| 9,129,869 | B2 | 9/2015 | Fay et al. | |
| 2008/0017873 | A1* | 1/2008 | Tomoda | ............ H01L 23/49811 257/90 |
| 2008/0315236 | A1* | 12/2008 | Lu | ......................... H01L 33/387 257/98 |
| 2011/0215292 | A1* | 9/2011 | Zaima | ..................... H01L 21/18 257/13 |
| 2014/0084240 | A1* | 3/2014 | Hu | ...................... H01L 25/0753 257/13 |
| 2016/0064630 | A1 | 3/2016 | Castro | |

* cited by examiner

MICRO DEVICE METAL JOINT PROCESS

RELATED APPLICATIONS

This application claims the benefit of priority of U.S. Provisional Application No. 62/516,559 filed Jun. 7, 2017 which is incorporated herein by reference.

BACKGROUND

Field

Embodiments described herein relate to micro devices. More particularly embodiments relate to the stabilization of micro device on a carrier substrate and transfer to a receiving substrate.

Background Information

State of the art displays for phones, tablets, computers, and televisions utilize glass substrates with thin film transistor (TFTs) to control transmission of backlight though pixels based on liquid crystals. More recently emissive displays such as those based on organic light emitting diodes (OLEDs) have been introduced as being more power efficient, and allowing each pixel to be turned off completely when displaying black. Even more recently, it has been proposed to incorporate emissive inorganic semiconductor-based micro LEDs into high resolution displays.

In one implementation, it has been proposed to transfer an array of inorganic semiconductor-based micro LEDs from a carrier substrate to a receiving (e.g. display) substrate using an array electrostatic transfer heads. For example, it has been proposed in U.S. Pat. No. 8,835,940 to stage an array of micro LEDs on an array of stabilization posts formed of an adhesive bonding material, such as a thermoset material. During the transfer process, it is described that the array of electrostatic transfer heads generate a sufficient pressure to overcome the adhesion strength between the adhesive bonding material and the micro LEDs.

SUMMARY

Embodiments describe metal-to-metal adhesion joints to hold down micro devices to a carrier substrate within the context of a micro device transfer manufacturing process. In accordance with embodiments the micro devices may include residual nubs protruding from their bottom contacts at the conclusion of the micro device transfer process. For example, the nubs may be embedded within metallic joint used to join the micro devices to a receiving substrate. Alternatively, the nubs may at least partially diffuse within the metallic joint and form volumes of interstitial metallic material embedded within the metallic joint. In an embodiment, the nubs are formed as the result of a pick up operation, in which portions of metal posts used to form metal-to-metal adhesion joints with the micro devices are picked up along with the micro devices. In another embodiment, the nubs are formed as part of the bottom contacts of the micro devices.

DETAILED DESCRIPTION

Figure 1A:
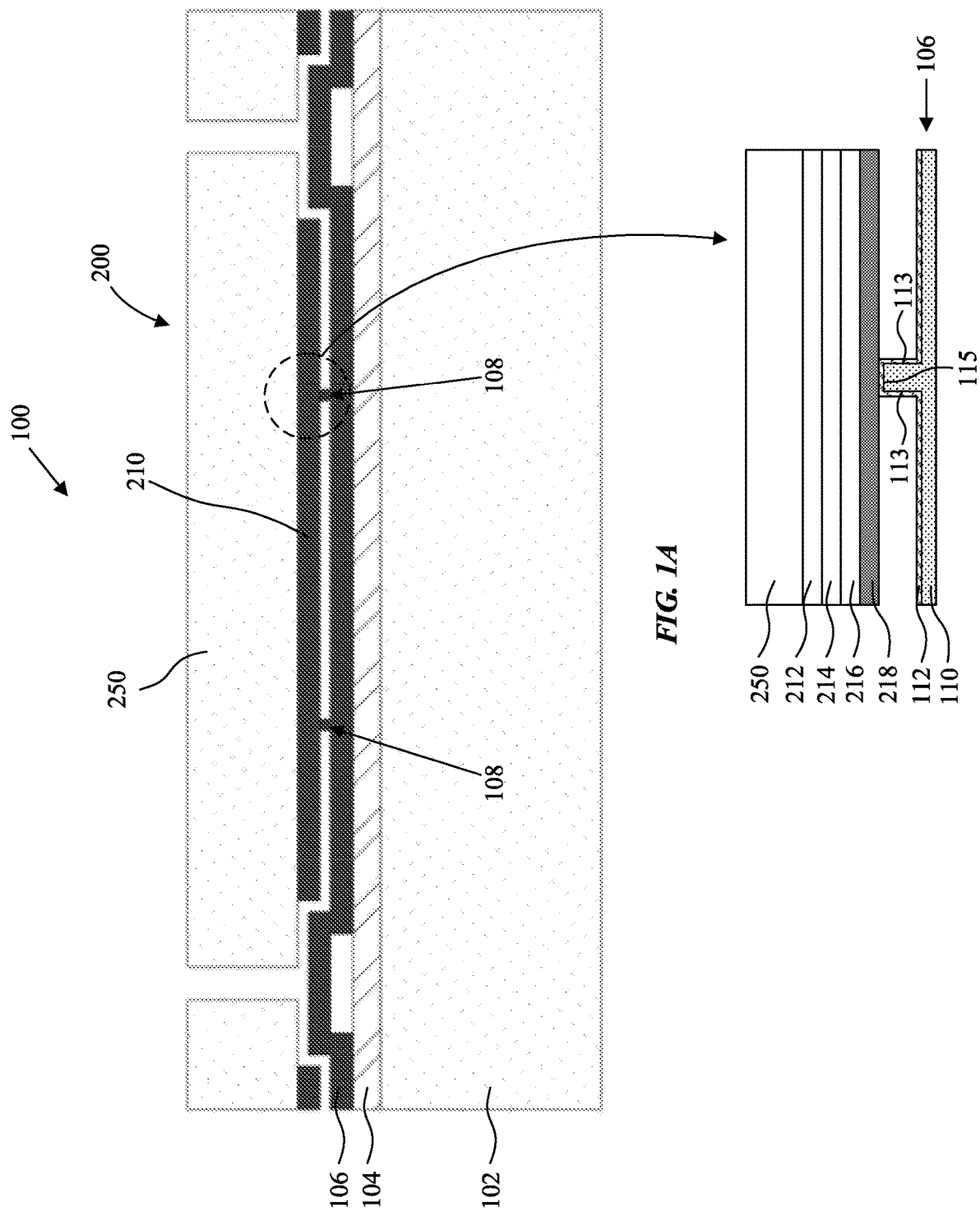
FIG. 1A is a cross-sectional side view illustration of a micro device poised for pick upon on a plurality of stabilization posts in accordance with an embodiment.

Embodiments describe structures and methods of forming metal-to-metal adhesion joints to hold down micro devices to a carrier substrate within the context of a micro device transfer manufacturing process.

It has been observed that micro device transfer processes utilizing implementations of a stabilization layer that retains micro devices on the carrier substrate by way of surface adhesion may be unreliable, with an observed wide distribution of adhesion force among micro devices. For example, U.S. Pat. No. 8,835,940 describes an implementation which utilizes surface chemistry interaction of polymers such as benzocyclobutene (BCB) to a gold surface achieved during spin coating. It has been observed that such a process may be sensitive to pre-spin coat processing, as well as the fluidic interaction in and around the openings within the sacrificial release layer used to define adhesion of the stabilization posts. This variation of adhesion may in turn translate to a measurable micro device pick up yield within a volume manufacturing process.

In accordance with embodiments, a sputtered, evaporated or electroplated metal-to-metal joint is described to hold down micro devices to their respective carrier substrate. In an embodiment, a metal contact pad is fabricated for the bottom contact of a corresponding micro device. A sacrificial release layer is then deposited and patterned, followed by the deposition of a blanket metal layer over the entire surface of the wafer. This blanket metal layer may include multiple layers, such as an adhesion layer and a bulk layer. This blanket metal layer becomes the stabilization layer including the stabilization posts which form the metal joint in the contact openings within the sacrificial release layer. The substrate may then be bonded to a carrier substrate using a variety of methods, including blanket polymer, eutectic, or thermocompression bonding techniques. In another embodiment, one or more nano-pillars are formed within the bottom contact to define the area of the metal-to-metal joints. In such an embodiment, the stabilization posts in effect have been created within the bottom contact.

In one aspect, the metal-to-metal joints in accordance with embodiments may provide alternative approaches for adhering micro devices to a carrier substrate that eliminate variable fluidic and surface chemistry effects. In place, adhesion strength may be determined by metal properties and geometries.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", and "on" as used herein may refer to a relative position of one layer with respect to other layers. One layer "over", or "on" another layer or bonded "to" or in "contact" with another layer may be directly in contact with the other layer or may have one or more intervening layers. One layer "between" layers may be directly in contact with the layers or may have one or more intervening layers.

While embodiments are described with specific regard to micro LED devices comprising p-n diodes, it is to be appreciated that embodiments of the invention are not so limited and that certain embodiments may also be applicable to other micro devices which are designed in such a way so as to perform in a controlled fashion a predetermined electronic function (e.g. diode, transistor, integrated circuit, display circuitry, sensor) or photonic function (LED, laser). Embodiments are also applicable to micro chips.

The terms "micro" device, "micro" mesa, "micro" chip, or "micro" LED device as used herein may refer to the descriptive size of certain devices, chips, or structures in accordance with embodiments of the invention. As used herein the term "micro device" specifically includes "micro LED device" and "micro chip". As used herein, the terms "micro" devices or structures are meant to refer to the scale of 1 to 300 µm. In an embodiment, a single micro device or structure has a maximum dimension, for example length or width, of 1 to 300 µm, or 1 to 100 µm. In an embodiment, the top contact surface of each micro device, micro structure, or electrostatic transfer head has a maximum dimension of 1 to 300 µm, 1 to 100 µm, or more specifically 3 to 20 µm.

FIG. 1A is a cross-sectional side view illustration of a micro device poised for pick upon on a plurality of stabilization posts in accordance with an embodiment. As shown, the stabilization structure 100 includes a metallic stabilization layer 106 including one or more stabilization posts 108. A micro device 200 is on the one or more stabilization posts 108. The micro device 200 includes a bottom contact 210 that is in direct contact with and wider than a corresponding stabilization post 108 directly underneath the bottom contact 210. In a particular embodiment, the micro device is a micro LED device including a micro p-n diode 250.

As shown in the close up illustration, the bottom contact 210 may be a multiple layer stack. In an accordance with embodiments, the multiple layer stack may include a number of combinations of layers such as a contact layer, mirror layer, barrier layer, and interface layer, though not all layers are required, and different layers may be included. For example, a bottom contact 210 may include a contact layer 212 for ohmic contact, a mirror layer 214, a barrier layer 216, and an interface layer 218. Various adhesion layers may be formed between any of the layers within the layer stack. In an embodiment, contact layer 212 is formed of a high work-function metal such as nickel. In an embodiment, a mirror layer 214 such as silver or aluminum is formed over the contact layer 212 to reflect the transmission of the visible wavelength emitted from the micro p-n diode 250. In an embodiment, platinum is used as a diffusion barrier layer 216 to interface layer 218. Interface layer 218 may be formed of a variety of materials that can be chosen for bonding to the receiving substrate and/or to achieve the requisite tensile strength or adhesion or surface tension with the stabilization posts.

In an embodiment, interface layer 218 is formed of a conductive material (both pure metals and alloys) that can diffuse with a bonding layer (e.g. gold, indium, or tin) on a receiving substrate and is also amenable to forming a metal-to-metal joint on the carrier substrate 102. While embodiments are not limited to specific metals, exemplary materials for interface layer 218 include gold and aluminum, as well as their alloys.

In accordance with an embodiment, a sputtered or evaporated metal-to-metal joint is described to hold down micro devices to their respective carrier substrate. In this manner, adhesion strength is determined by metal properties of the materials and geometries forming the metal-to-metal joints. In an embodiment, total adhesion may be within a workable range so that the pick up can be achieved with an applied pick up pressure on the transfer head of 20 atmospheres or less, or more particularly 5-10 atmospheres.

The metallic stabilization layer 106 in accordance with embodiments may be formed of one or more layers and materials. For example, the stabilization layer may include a bulk layer 110 and optional adhesion layer 112 to promote adhesion with the bulk layer 110 and the bottom contact 210. As shown, the optional adhesion layer 112 may line the sidewalls 113 and top surface 115 of the bulk layer 110 for a stabilization post 108. While embodiments are not limited to specific metals, exemplary materials for bulk layer 110 include gold and aluminum, as well as alloys in which elemental impurities can be added to tailor mechanical properties (e.g. yield strength, hardness, ductility) of the metal-to-metal joint. Exemplary elemental impurities that may be included are Co, Ni, Be, Al, Ca, Mo, Au. In an embodiment, a gold alloy material includes 0 to 5% by weight of impurity. The interface layer 218 may additionally be formed of any of these materials. While embodiments are not limited to specific metallic materials, exemplary materials for adhesion layer 112 include Ti, TiW, and Ni. Adhesion layer 112 may also be selected to control joint adhesion, and additionally the break point during the transfer process. Geometry of the stabilization posts 108 may also be varied to control adhesion. For example, the stabilization posts 108 and resultant metal-to-metal joints may be in the form of solid posts, annular rings, etc. The number of stabilization posts 108 and location can also be adjusted to control the pull force required for transfer.

In an embodiment, a stabilization structure includes a metallic stabilization layer 106 with an array of stabilization posts 108, and an array of micro devices 200 on the array of stabilization posts 108. Each micro device 200 includes a bottom contact 210 that is in direct contact with and wider than a corresponding stabilization post 108 directly underneath the bottom contact 210. Specifically, the bottom contact 210 includes an interface layer 218, and the stabilization post 108 is in direct contact with the interface layer 218. In an embodiment, the stabilization post 108 and the interface layer 218 formed of materials sharing a same metallic element, such as gold or aluminum. In an embodiment, the interface layer is formed of gold, while the stabilization layer includes a gold alloy. The stabilization layer 106 may additionally include an adhesion layer 112 and a bulk layer 110, with the adhesion layer 112 being in direct contact with the interface layer 218. In an embodiment, each stabilization post has a maximum width of less than 0.5 μm. In an embodiment, plurality of stabilization posts 108 in direct contact with each interface layer 218.

Figure 1B:
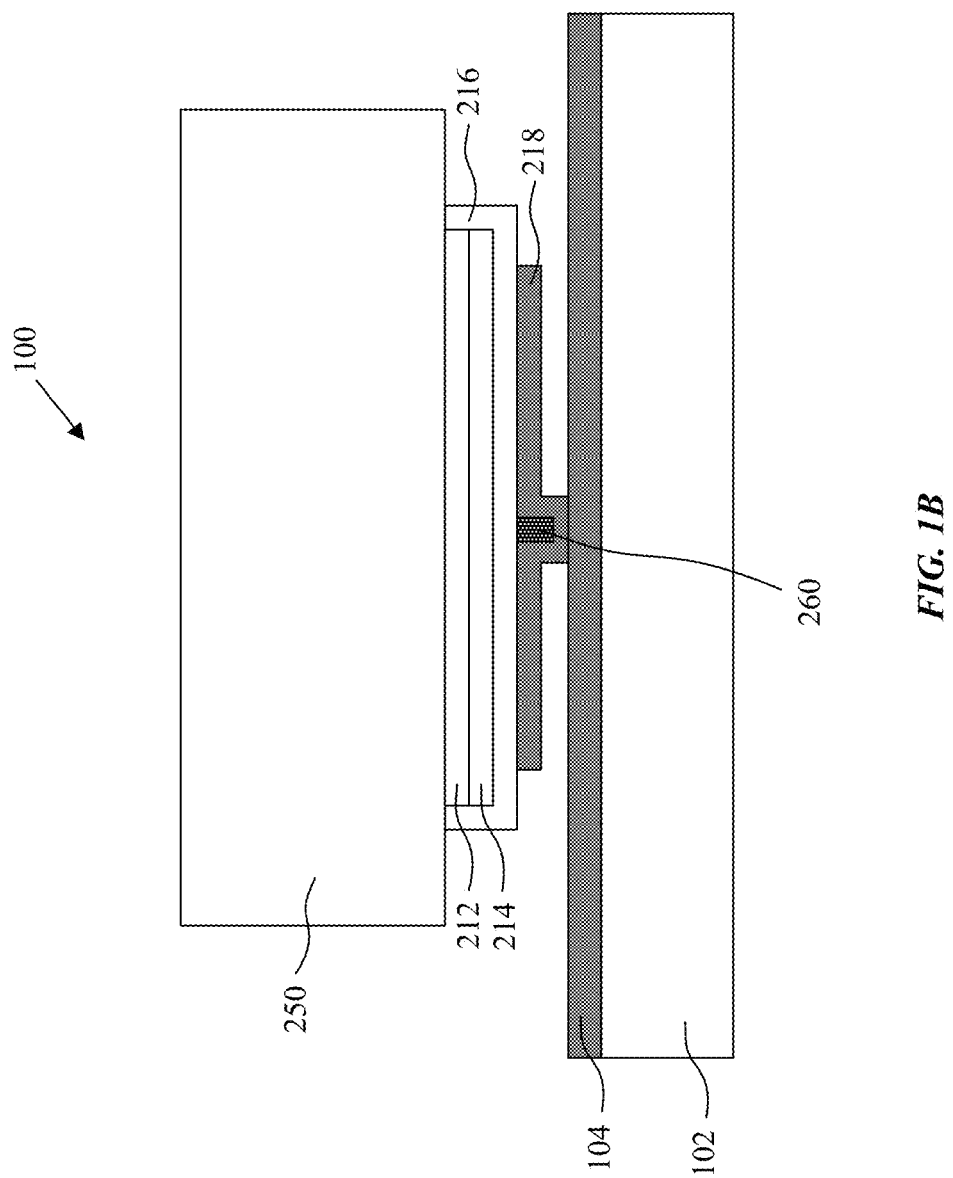
FIG. 1B is a cross-sectional side view illustration of a micro device with a nano-pillar within a bottom contact in accordance with an embodiment.

FIG. 1B is a cross-sectional side view illustration of a stabilization structure 100 including a micro device with a nano-pillar within a bottom contact in accordance with an embodiment. In particular, the embodiment illustrated in FIG. 1B is designed to create one or more protrusions within the bottom contact 210 rather than separately forming stabilization posts. Specifically, the micro device 200 structure may include a micro p-n diode 250 and a bottom contact 210. In addition to including any of a contact layer 212, mirror layer 214, barrier layer 216, and interface layer 218 as previously described with regard to FIG. 1A, the bottom contact 210 includes one or more nano-mesas 260. The nano-mesas 260 may be formed on the micro p-n diode 250 prior to forming the other layers of the bottom contact 210, between any layers within the bottom contact 210, or formed on and after the interface layer 218. In the specific embodiment illustrated in FIG. 1B, the nano-mesas are formed just prior to the interface layers 218, so as to create a protruding profile within the bottom contact 210.

In accordance with embodiments, the nano-mesas 260 may be of similar size and shape as the stabilization posts 108 described herein, such as between 100 nm and 1,000 nm wide, or more specifically approximately 200 nm to 500 nm wide, and between approximately 0.25 and 3 microns thick, or more specifically approximately 0.5 to 1 microns thick. In this manner, the interface layer 218 formed over a corresponding nano-mesa 260 protrudes from the surrounding areas of the bottom contact 210/interface layer 218. The protruding portion of the interface layer 218 may be bonded, for example, using thermocompression bonding, to a joining layer 104 on the carrier substrate 102. In an embodiment, the joining layer 104 and interface layer 218 are formed of the same or different materials to facilitate thermocompression bonding and create the metal-to-metal joint, control adhesion, and break point. The joining layer 104 illustrated in FIG. 1B may be formed of any of the materials described with regard to the stabilization layer 106 of FIG. 1A. The joining layer 104 may also including multiple layers.

Figure 2:
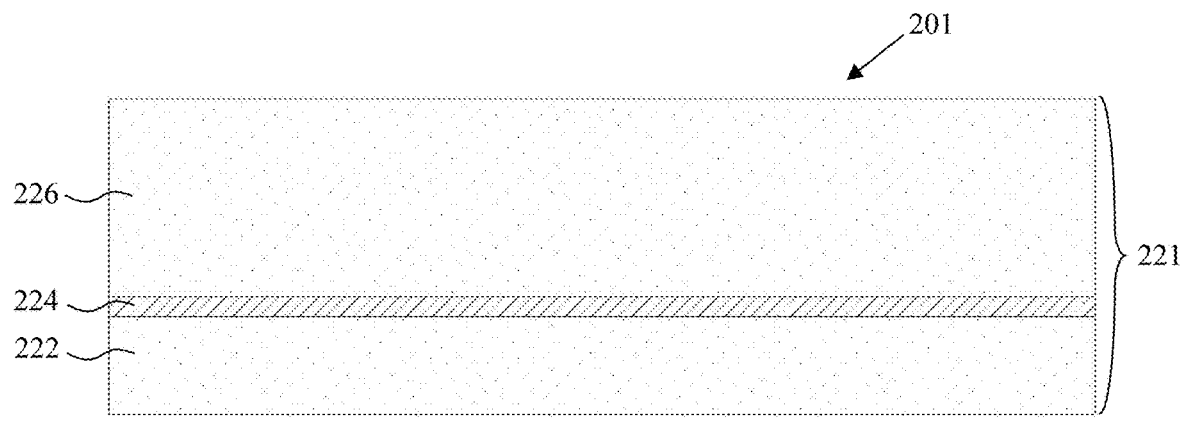
FIG. 2 is a cross-sectional side view illustration of a bulk LED substrate in accordance with an embodiment.

Referring now to FIGS. 2-9 cross-sectional side view illustrations are provided of a method of forming an array of micro devices supported by an array of stabilization posts such as that illustrated in FIG. 1A in accordance with embodiments. FIG. 2 is a cross-sectional side view illustration of a bulk LED substrate in accordance with an embodiment. As shown, the process sequence may start with a bulk LED substrate 201 including a p-n diode layer 221 including a first doped layer 226 doped with a first dopant type (e.g. n-type), a second doped layer 222 doped with a second dopant type (e.g. p-type) opposite the first dopant type, and an active layer 224 between the doped layers 226, 222. The active layer 224 may include one or more quantum well layers separated by barrier layers. In accordance with embodiments, the p-n diode layer 221 may be formed of III-V or II-VI inorganic semiconductor-based materials, and be designed for emission at a variety of primary wavelengths, such as red, green, blue, etc.

Figure 3:
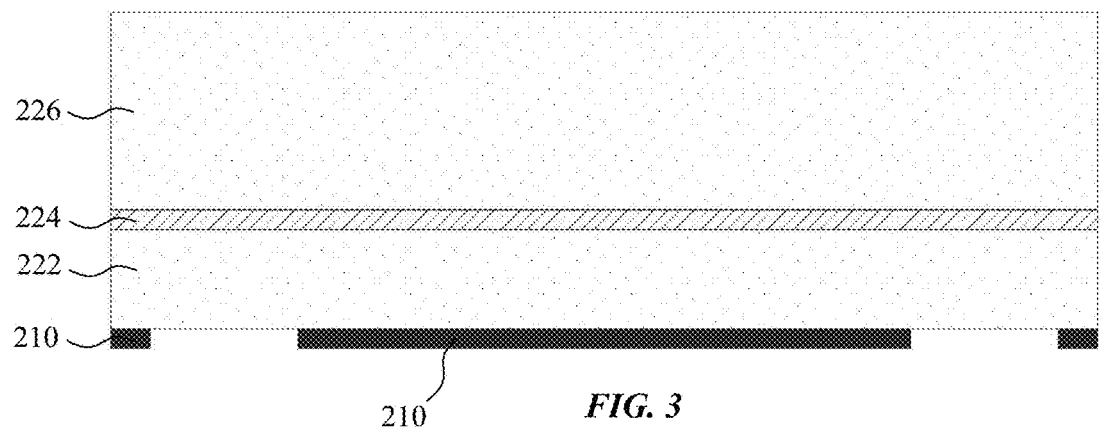
FIG. 3 is a cross-sectional side view illustration of an array of bottom contacts formed on a bulk LED substrate in accordance with an embodiment.

An array of laterally separate bottom contacts 210 are then formed on the doped layer 222 as illustrated in FIG. 3. As previously described with regard to FIG. 1A, the bottom contacts may include multiple layers, such as a contact layer 212 for ohmic contact, a mirror layer 214, a barrier layer 216, and an interface layer 218.

Figure 4:
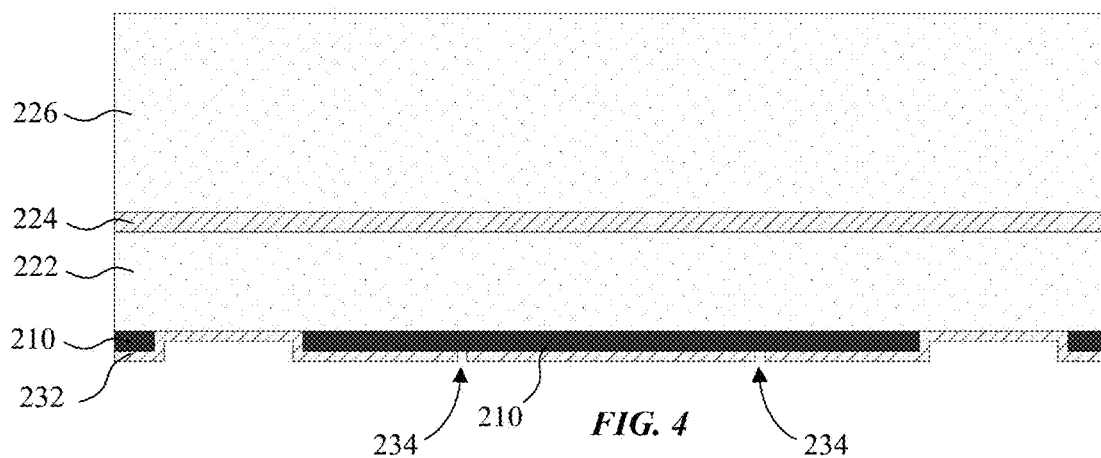
FIG. 4 is a cross-sectional side view illustration of the formation of a patterned sacrificial release layer in accordance with an embodiment.

Referring now to FIG. 4 a sacrificial layer 232 is formed over the bottom contacts 210 on the bulk LED substrate 201 in accordance with an embodiment. In an embodiment, sacrificial layer 140 is between approximately 0.1 and 2 microns thick, or more specifically approximately 0.5 microns thick. In an embodiment, sacrificial layer is formed of an oxide (e.g. $SiO_2$) or nitride (e.g. $SiN_x$), though other materials may be used which can be selectively removed with respect to the other layers. The sacrificial layer 232 may then be patterned to form an array of contact openings 234 exposing the bottom contacts 210. In accordance with embodiments, the thickness of the sacrificial layer 232 and shape of the contact openings 234 determine the shape and side of the stabilization posts to be formed, and the resultant area of the metal-to-metal joint. In an embodiment, the contact openings are between 100 nm and 1,000 nm wide, such as approximately 200 nm-500 nm wide.

Figure 5:
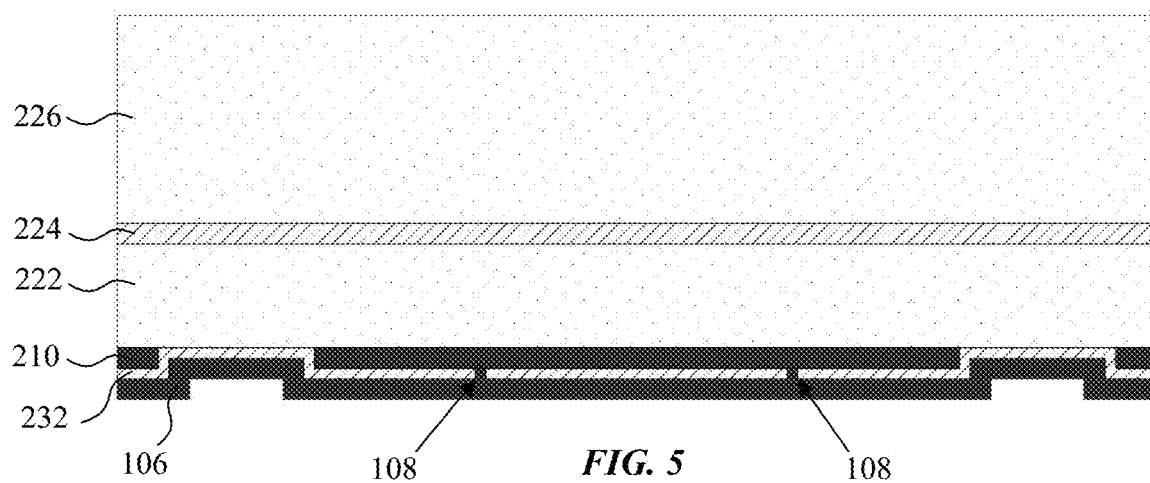
FIG. 5 is a cross-sectional side view illustration of the formation of a metallic stabilization layer in accordance with an embodiment.

Referring now to FIG. 5 a metallic stabilization layer 106 is blanket deposited over the sacrificial layer 232 and within the array of contact openings 234 using a suitable technique such as sputtering, evaporation or electroplating. The portion of the metallic stabilization layer 106 within the contact openings 234 forms the stabilization posts 108 and metal-to-metal joints with the bottom contacts 210. In an embodiment, the metallic stabilization layer 106 includes a total thickness of up to 3 microns, such as 1.5 microns, and may be sufficiently thick to fill the contact openings 234 as part of a continuous layer. The metallic stabilization layer 106 may include one or more adhesion layers 112 and a bulk layer 110 as described with regard to FIG. 1A.

Figure 6:
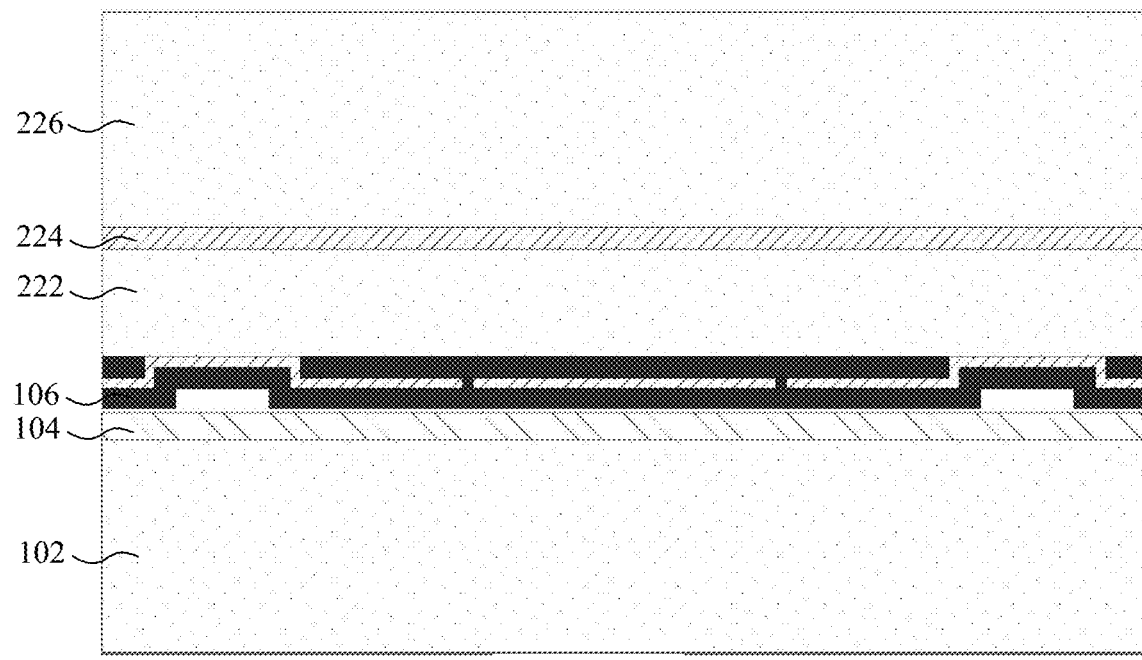
FIG. 6 is a cross-sectional side view illustration of the metallic stabilization layer bonded to a carrier substrate in accordance with an embodiment.
Figure 7:
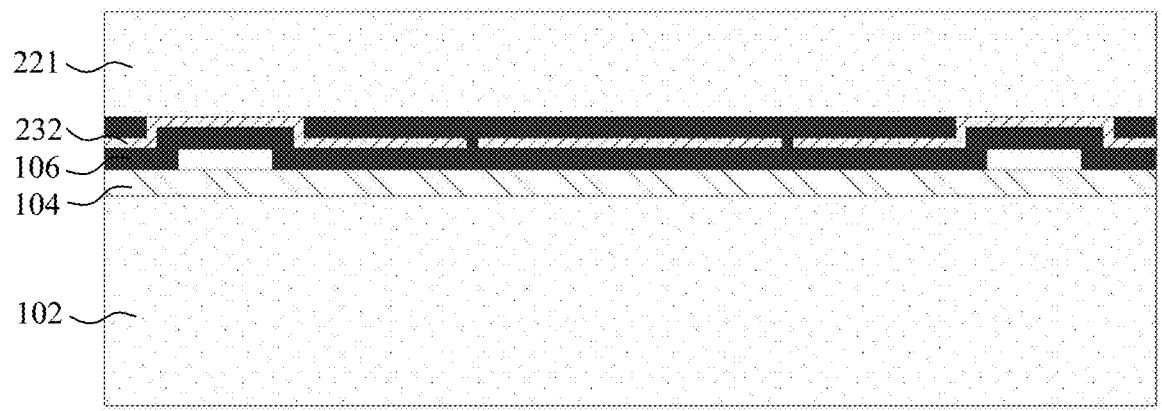
FIG. 7 is a cross-sectional side view illustration of a thinned p-n diode layer in accordance with an embodiment.

Referring now to FIG. 6, the substrate stack is then bonded to a carrier substrate 102. For example, the metallic stabilization layer 106 may be bonded to the carrier substrate 102 using polymer or metal joining layer 104, or with thermocompression bonding techniques. Following bonding to the carrier substrate 102, the p-n diode layer 221 may be thinned and any growth substrates or buffer layers removed from the doped layer 226 as shown in FIG. 7.

Figure 8:
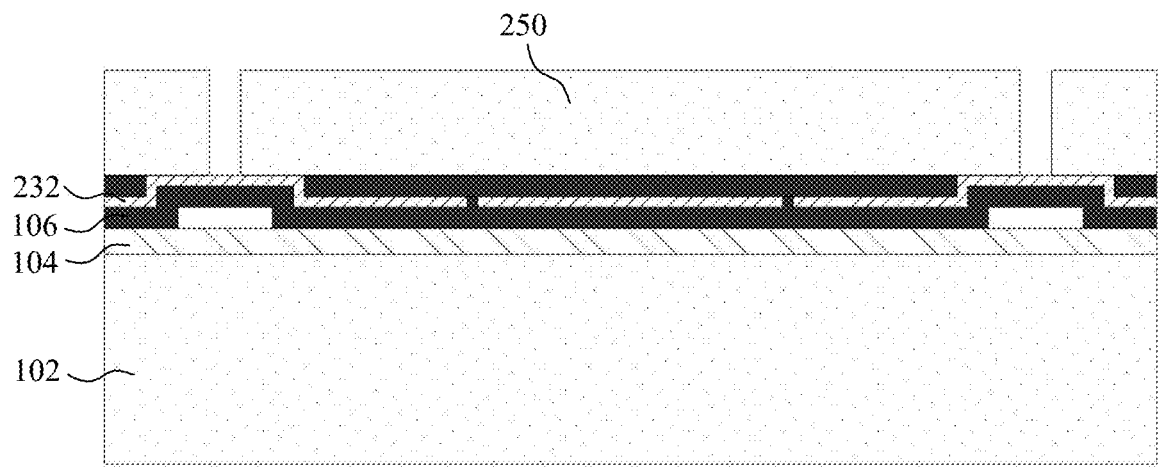
FIG. 8 is a cross-section side view illustration of a plurality of mesa structures formed in an LED device layer in accordance with an embodiment.
Figure 9:
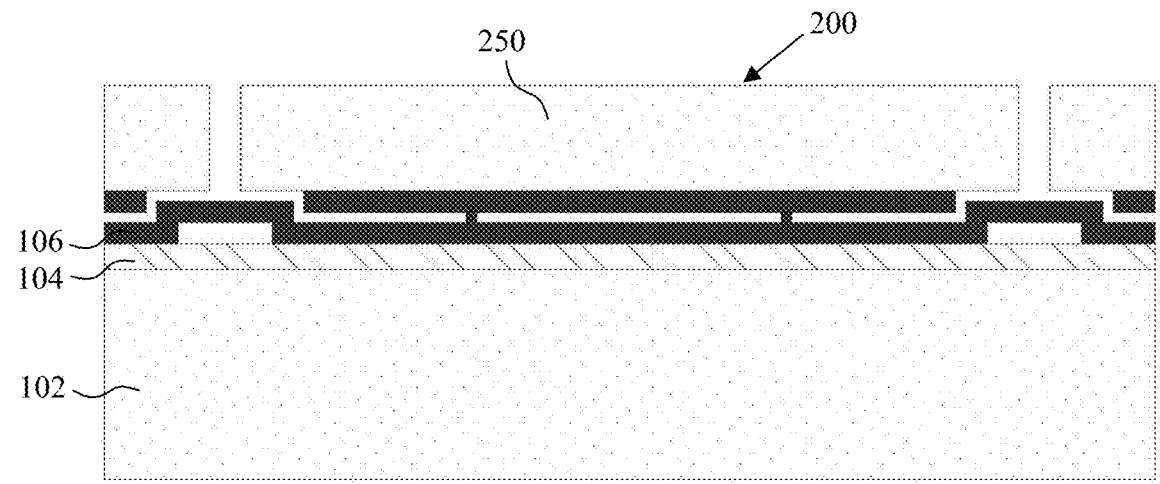
FIG. 9 is a cross-section side view illustration of the removal of the sacrificial release layer in accordance with an embodiment.

Referring now to FIG. 8, the p-n diode layer 221 is etched to form an array of laterally separate micro p-n diode mesa structures 200 and expose the sacrificial layer 232. In an embodiment, etching is performed using dry etching technique. The sacrificial layer 232 may then be removed as illustrated in FIG. 9 using a suitable technique such as vapor-phase etching resulting in an array of micro devices 200 that are poised for pick up, and retained on the carrier substrate 102 by the array of stabilization posts 108. As shown, a void 242 may surround the bottom and side surfaces of the micro devices 200 such that they are only retained on the carrier substrate 102 by the stabilization posts 108.

Figure 10A:
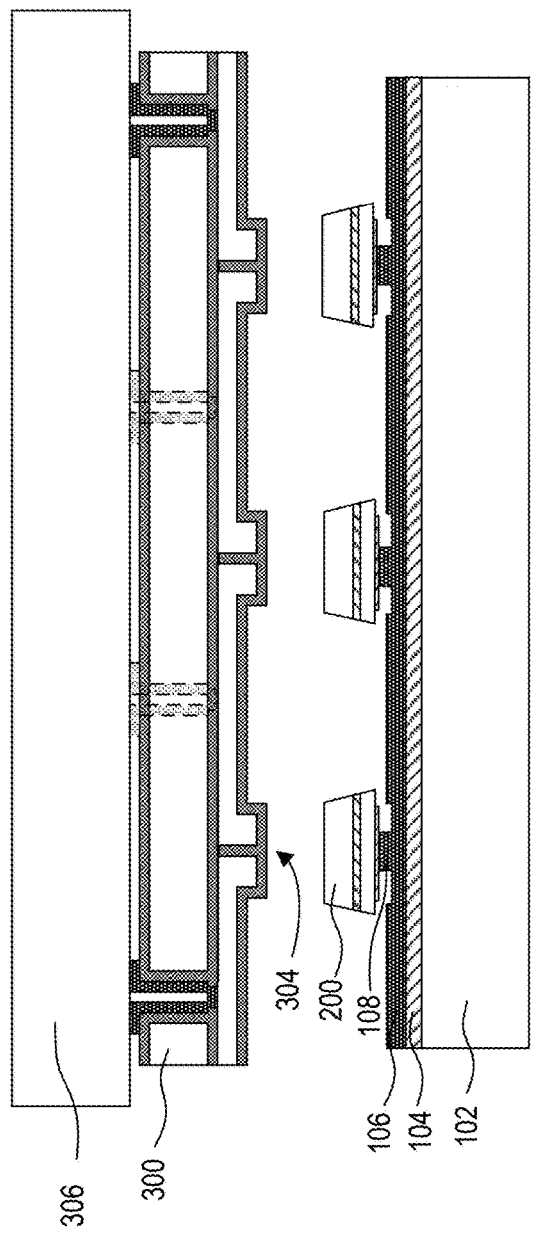
FIG. 10A is a cross-sectional side view illustration of an array of electrostatic transfer heads positioned over an array of micro devices on a carrier substrate in accordance with an embodiment.
Figure 10B:
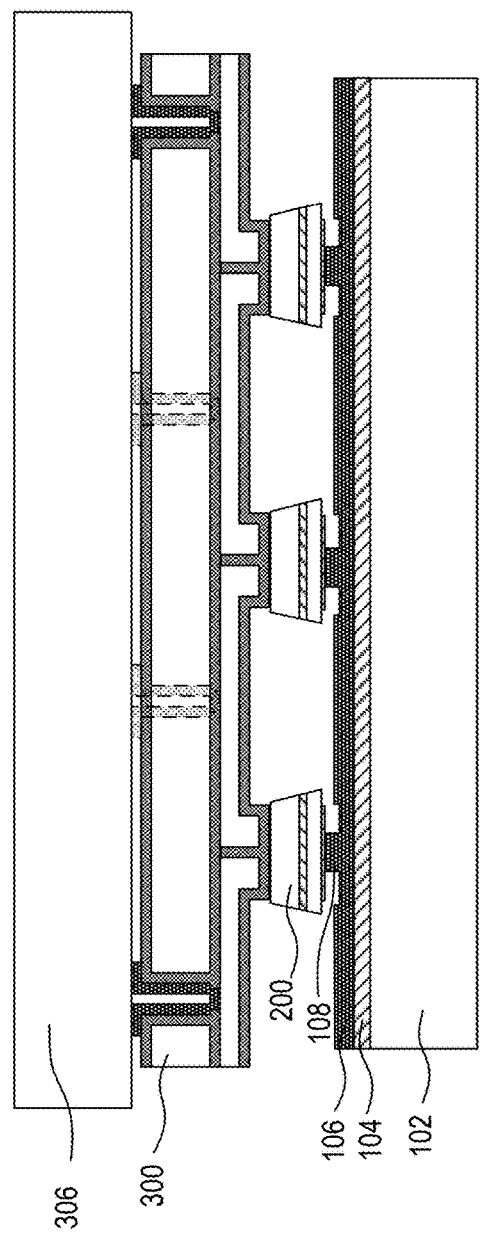
FIG. 10B is a cross-sectional side view illustration of an array of electrostatic transfer heads in contact with an array of micro devices in accordance with an embodiment.
Figure 10C:
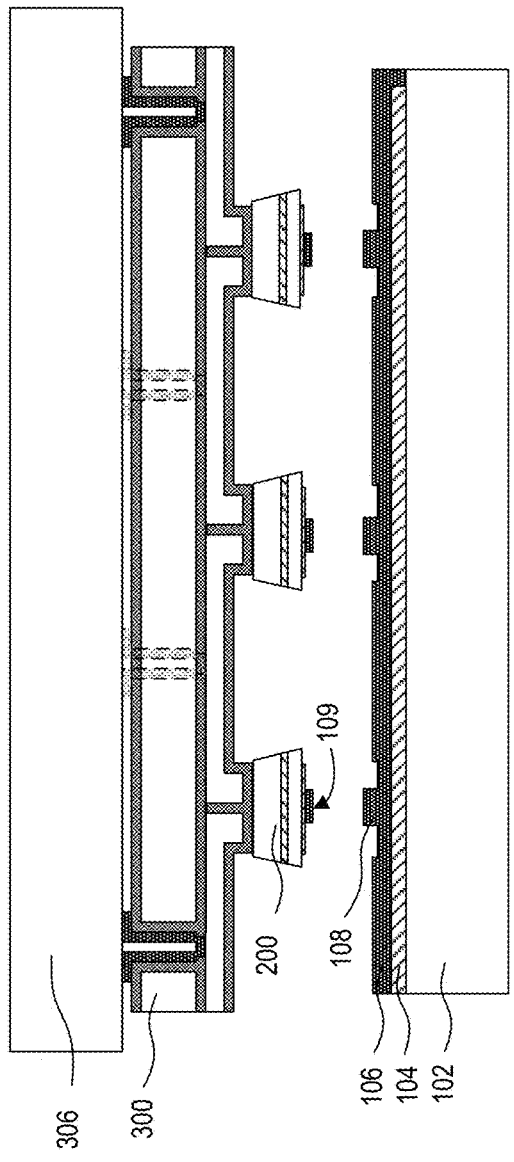
FIG. 10C is a cross-sectional side view illustration of an array of electrostatic transfer heads picking up an array of micro devices in accordance with an embodiment.

FIGS. 10A-10E are cross-sectional side view illustrations of a method of picking up and transferring an array of micro devices from a carrier substrate to a receiving substrate in accordance with an embodiment. FIG. 10A is a cross-sectional side view illustration of an array of micro device transfer heads 304 supported by substrate 300 and positioned over an array of micro devices 200 stabilized on stabilization posts 108 of stabilization layer 106 on a carrier substrate 102 in accordance with an embodiment. The array of micro devices 200 is then contacted with the array of transfer heads 304 as illustrated in FIG. 10B. A voltage is applied to the array of transfer heads 304. The voltage may be applied from the working circuitry within a transfer head assembly 306. The array of micro devices 200 is then picked up with the array of transfer heads 304 as illustrated in FIG. 10C. As shown, the pick up operation may result in nubs 109 of the stabilization posts 108 also being picked up, with the nubs 109 protruding from the bottom contacts 210.

Figure 10D:
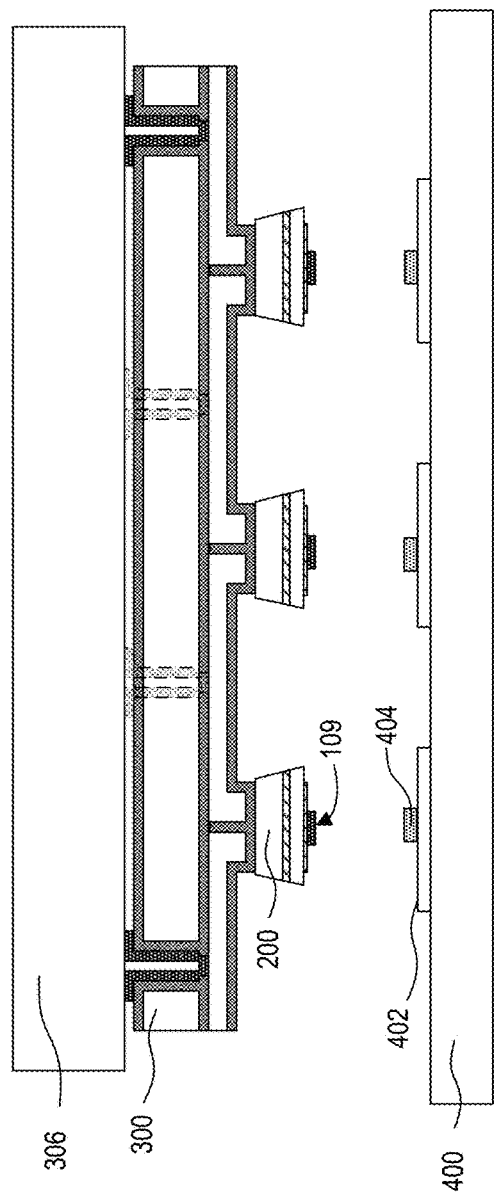
FIG. 10D is a cross-sectional side view illustration of an array of micro devices positioned over a receiving substrate in accordance with an embodiment.
Figure 10E:
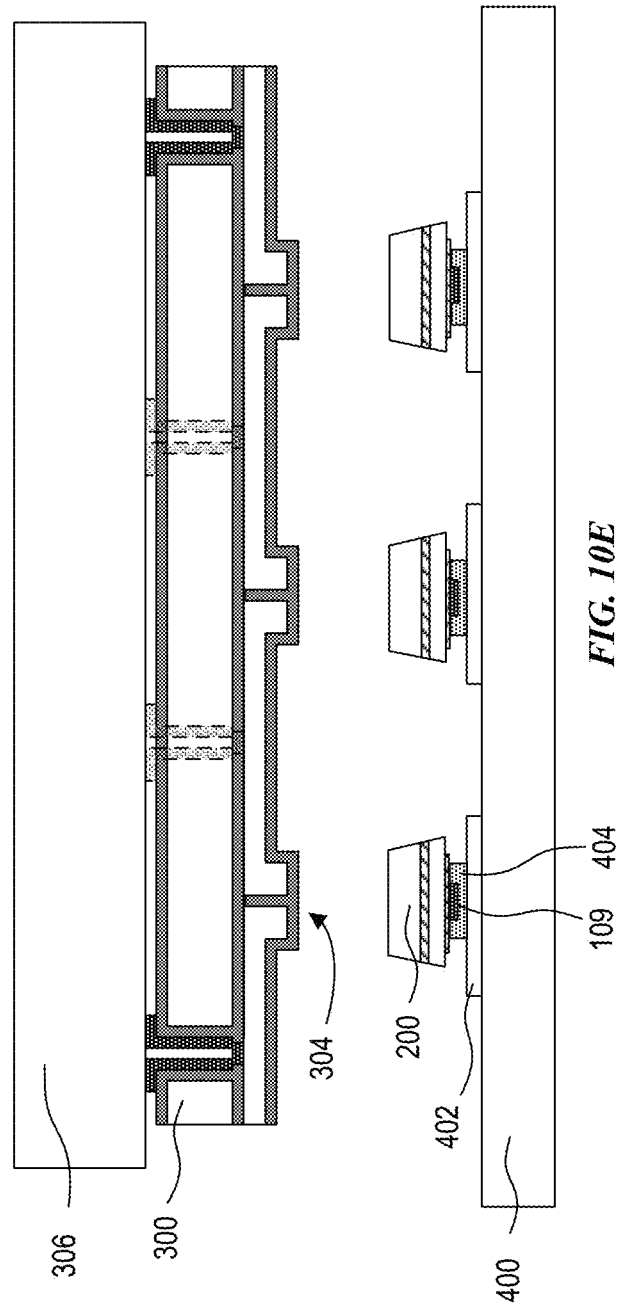
FIG. 10E is a cross-sectional side view illustration of an array of micro devices released onto a receiving substrate in accordance with an embodiment.

Referring now to FIGS. 10D-10E, the array of micro devices 200 is positioned over an array of contact pads 402 on a receiving substrate 400. The array of micro devices 200 is then bonded to the receiving substrate 400 and released form the array of micro device transfer heads 304. In accordance with embodiments, bonding layers 404 are formed on the contact pads 402 to facilitate bonding with the interface layers 218 of the micro devices 200. For example, bonding may be accomplished through reflow of the bonding layers 404 to form metallic joints. Reflow may additionally be accompanied by diffusion with the interface layers 218 to form compound regions 450 within the metallic joints. For example, the bonding layers 404 may be formed of a solder material such as indium, tin, etc. that can form an alloy or other compound with the interface layer 218.

Figure 11A:
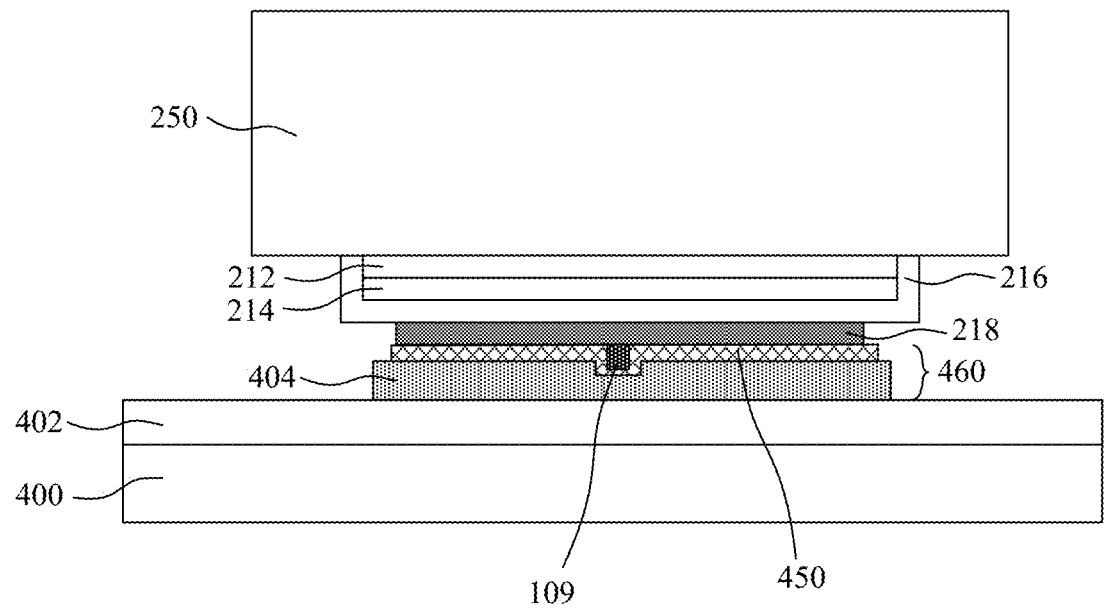
FIG. 11A is a cross-sectional side view illustration of a micro device including a nub protruding from a bottom contact bonded to a receiving substrate in accordance with an embodiment.
Figure 11B:
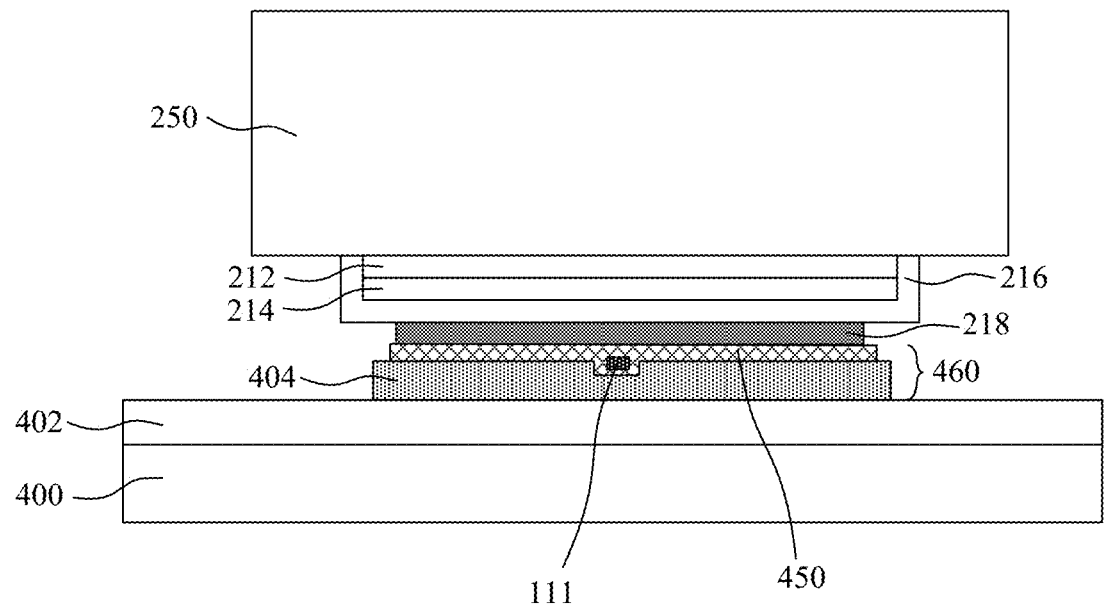
FIG. 11B is a cross-sectional side view illustration of a micro device including a partially diffused nub bonded to a receiving substrate in accordance with an embodiment.
Figure 12:
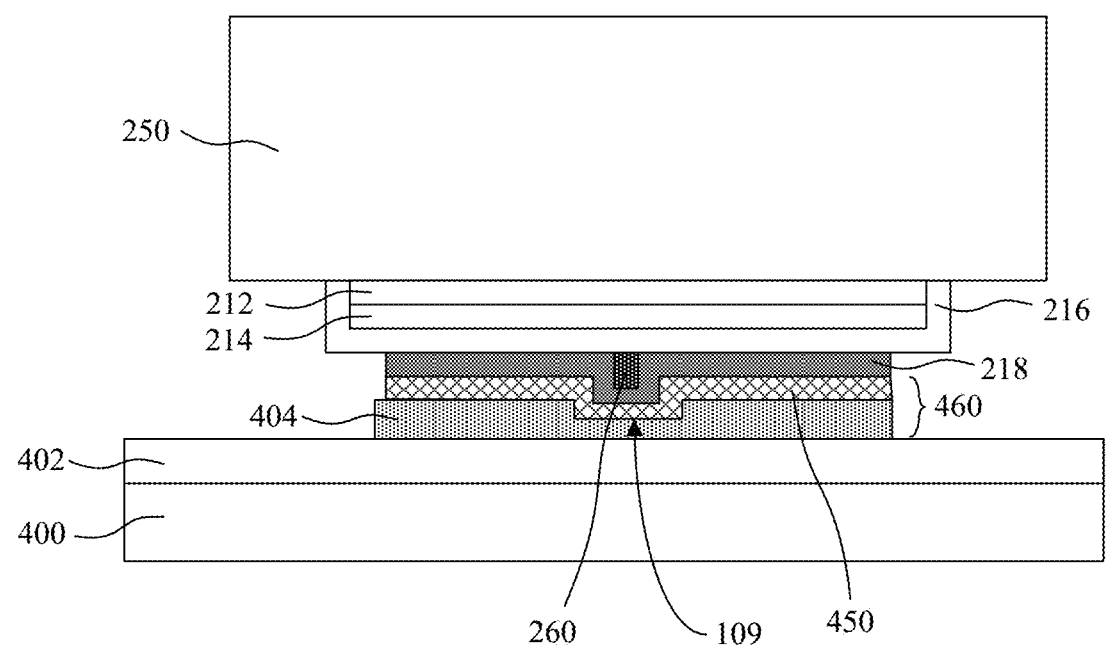
FIG. 12 is a cross-sectional side view illustration of a micro device including a nano-pillar bonded to a receiving substrate in accordance with an embodiment.

Referring now to FIGS. 11A-11B cross-sectional side view illustrations are provided of a micro device of FIG. 1A after being transferred and bonded to a receiving substrate in accordance with embodiments. FIG. 12 is a cross-sectional side view illustration of a micro device of FIG. 1B after being transferred and bonded to a receiving substrate in accordance with an embodiment. As described with regard to FIGS. 10A-10E, the transfer process in accordance with embodiments may include the use of a bonding layer 404 on the receiving substrate to facilitate bonding of the micro devices 200 to form metallic joints 460. In particular, the bonding layer 404 may reflow during the transfer sequence. For example, this may be accomplished by the transfer of heat through the micro device transfer heads 304. The transfer of heat and reflow, in turn, may cause diffusion across the interface layer 218 and bonding layer 404, and possibly the nub 109, resulting in a compound region 450. In accordance with embodiments, the compound region 450 and any remaining bonding layer 404 material are referred to together as a metallic joint 460.

In accordance with embodiments such as those illustrated in FIG. 11A and FIG. 12, a light emitting structure may include a landing pad 402, a metallic joint 460 on the landing pad, and an LED. The LED includes a bottom contact 210 bonded with metallic joint 460 on the landing pad 402, and a nub 109 that protrudes from the bottom contact 210 and is embedded within the metallic joint 460. Specifically, the nub 109 illustrated in FIG. 11A may be a portion of a stabilization post 108 that was pulled from a carrier substrate 102 during a transfer sequence. The nub 109 illustrated in FIG. 12 may be a protrusion of the bottom contact 210. For example, the nub 109 may include a nano-pillar 109 formed on or within the bottom contact 210.

In accordance with embodiments, the nubs 109 may be at specific geometric locations of the bottom contact 210. In an embodiment, the one or more nubs 109 may be arranged with a balanced center of gravity of the LED. For example, a light emitting structure may include a single nub 109 located at a center of the bottom contact. A light emitting structure including three or more nubs 109 may be arranged in a geometric pattern to have evenly supported weight of the LED when on the carrier substrate. A plurality of nubs 109 may also be arranged to have prevented tipping or tilting of the LED when on the carrier substrate.

In an embodiment the nub 109 includes an adhesion layer 112 and bulk layer 110. The bottom contact 210 may include an interface layer 218 that is bonded to the metallic joint 460. In an embodiment, the interface layer 218 is consumed by the metallic joint 460. In the embodiment illustrated in FIG. 11A, the nub 109 is in direct contact with the interface layer 218. In the embodiment illustrated in FIG. 11B, the interface layer 218 is a portion of the nub 109. In an embodiment, the nub 109 has a maximum width of less than 0.5 µm. The nub 109 and the interface layer 218 may be formed of materials sharing a same metallic element, such as, but not limited to, gold and aluminum. In an embodiment, the interface layer is formed of gold, while the nub is formed of a gold alloy. The nub 109 may include multiple layers. For example, the nub 109 may include an adhesion layer 112 and a bulk layer 110, with the adhesion layer 112 in direct contact with the interface layer 218. Additionally, the LED may include a plurality of nubs 109 protruding from the bottom contact 210, with the plurality of nubs 109 embedded within the metallic joint 460. Similar to the embodiment illustrated in FIG. 11A, the plurality of nubs 109 may be in direct contact with the interface layer 218. The metallic joint 460 may be the result of reflow of a bonding layer 404. In an embodiment, the metallic joint 460 includes a compound region 450, where the compound region connects the bonding layer 404 and the interface layer 218.

Up until this point, a high temperature bonding process has been described in which the transfer of heat may cause reflow of the bonding layer 404, and diffusion across the interface layer 218 and the bonding layer 404 to form a compound region 450 within a metallic joint 460. The compound region 450 may partially or completely consume either of the interface layer 218 or bonding layer 404. FIG. 11B is an illustration of an embodiment in which the nub 109 diffuses with the bonding layer 404, resulting a volume of interstitial metallic material 111 embedded in the metallic joint 460. For example, this may be observed when the nub 109 had been formed of a material with a distinguishable chemical composition from the interface layer 218. This may also potentially be observed by distance and location, even where the nub 109 and interface layer 218 are formed of a similar composition. In such an instance, the presence of the interstitial metallic material 111 composition may be detected using a suitable technique such as transmission electron microscope energy-dispersive X-ray spectroscopy (TEM-EDS) and Secondary Ion Mass Spectrometry (SIMS).

In an embodiment such as that illustrated in FIG. 11B, a light emitting structure includes a landing pad 402, a metallic joint 460 on the landing pad, and an LED that includes a bottom contact 210 bonded with the metallic joint 460 on the landing pad. One or more volumes of interstitial metallic material 111 are embedded within the metallic joint 460. In an embodiment, a volume of interstitial metallic material 111 is confined to an area of less than 0.5 µm width. In an embodiment, a volume of interstitial metallic material 111 is beneath a center of the LED. In an embodiment, the metallic joint includes a bonding layer 404 and a compound region 450, and the compound region 450 connects the bonding layer 404 and the interface layer 218. In an embodiment, the volume of interstitial metallic material 111 includes a top volume of a first composition (e.g. of adhesion layer 112) and a bottom volume of a second composition (e.g. of bulk layer 110) different from the first composition. The first composition may substantially surround the second composition on top and lateral sides.

In utilizing the various aspects of the embodiments, it would become apparent to one skilled in the art that combinations or variations of the above embodiments are possible for forming metal-to-metal adhesion joints to hold down micro devices to a carrier substrate within the context of a micro device transfer manufacturing process. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A light emitting structure comprising:
   a landing pad;
   a metallic joint on the landing pad;
   a light emitting diode that includes a bottom contact bonded with the metallic joint on the landing pad, and a nub protruding from the bottom contact;
   wherein the nub is embedded within the metallic joint;
   wherein the nub comprises a bulk layer and an adhesion layer lining a top surface and sidewalls of the bulk layer, the adhesion layer in direct contact with the bottom contact between the bulk layer and the bottom contact.

2. The light emitting structure of claim 1, wherein the bottom contact comprises an interface layer that is bonded to the metallic joint, and the adhesion layer is in direct contact with the interface layer.

3. The light emitting structure of claim 2, wherein the nub and the interface layer formed of materials sharing a same metallic element.

4. The light emitting structure of claim 3, wherein the metallic element is selected from the group consisting of gold and aluminum.

5. The light emitting structure of claim 3, wherein the interface layer is formed of gold, and the nub is formed of a gold alloy.

6. The light emitting structure of claim 2 comprising a plurality of nubs protruding from the bottom contact, wherein the plurality of nubs are embedded within the metallic joint, the bottom contact comprises an interface layer that is bonded to the metallic joint, and the plurality of nubs are in direct contact with the interface layer.

7. The light emitting structure of claim 2, wherein the metallic joint comprises a bonding layer and a compound region, wherein the compound region connects the bonding layer and the interface layer.

8. The light emitting structure of claim 2, wherein the nub has a maximum width of less than 0.5 µm.

* * * * *